(12) United States Patent
Bedell et al.

(10) Patent No.: US 7,705,345 B2
(45) Date of Patent: Apr. 27, 2010

(54) HIGH PERFORMANCE STRAINED SILICON FINFETS DEVICE AND METHOD FOR FORMING SAME

(75) Inventors: Stephen W. Bedell, Wappingers Falls, NY (US); Kevin K. Chan, Staten Island, NY (US); Dureseti Chidambarrao, Weston, CT (US); Silke H. Christianson, Halle (DE); Jack O. Chu, Manhasset Hills, NY (US); Anthony G. Domenicucci, New Paltz, NY (US); Kam-Leung Lee, Putnam Valley, NY (US); Anda C. Mocuta, Lagrangeville, NY (US); John A. Ott, Greenwood Lake, NY (US); Qiqing C. Ouyang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/751,916

(22) Filed: Jan. 7, 2004

(65) Prior Publication Data

US 2005/0145941 A1 Jul. 7, 2005

(51) Int. Cl.
*H01L 29/06* (2006.01)
*H01L 31/072* (2006.01)

(52) U.S. Cl. .................. 257/19; 257/15; 257/18; 257/20; 257/347

(58) Field of Classification Search .......... 257/15, 257/18, 19, 20, 347–349, 353, 401
See application file for complete search history.

(56) References Cited

U.S. PATENT DOCUMENTS

| | | | |
|---|---|---|---|
| 6,413,802 B1 | 7/2002 | Hu et al. | |
| 6,475,869 B1 * | 11/2002 | Yu | 438/303 |
| 6,593,625 B2 | 7/2003 | Christiansen et al. | |
| 6,774,390 B2 * | 8/2004 | Sugiyama et al. | 257/19 |
| 6,800,910 B2 * | 10/2004 | Lin et al. | 257/410 |
| 6,891,229 B2 * | 5/2005 | Franke et al. | 257/354 |

OTHER PUBLICATIONS

K. Rim et al., "Fabrication and Analysis of Deep Submicron Strained-Si N-MOSFET's", IEEE Trans. Electron Devices, 47(7), p. 1406-1415, (2000).
P.M. Mooney, "Materials Science and Engineering Reports R17", p. 105-146 (1996).
Yang-Kyu Choi et al., "Spacer FinFet: nanoscale double-gate CMOS technology for the terabit era", Solid-State Electronics, 46, p. 1595-1601, (2002).

* cited by examiner

*Primary Examiner*—Ori Nadav
(74) *Attorney, Agent, or Firm*—McGinn IP Law Group PLLC; Louis Percello, Esq.

(57) ABSTRACT

A strained Fin Field Effect Transistor (FinFET) (and method for forming the same) includes a relaxed first material having a sidewall, and a strained second material formed on the sidewall of the first material. The relaxed first material and the strained second material form a fin of the FinFET.

18 Claims, 9 Drawing Sheets

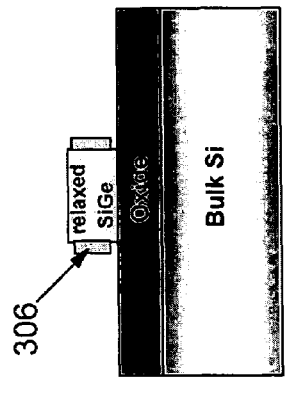
Figure 3C
Figure 3F
300
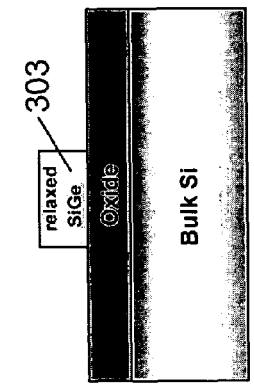
Figure 3B
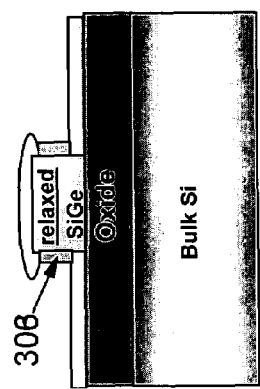
Figure 3E
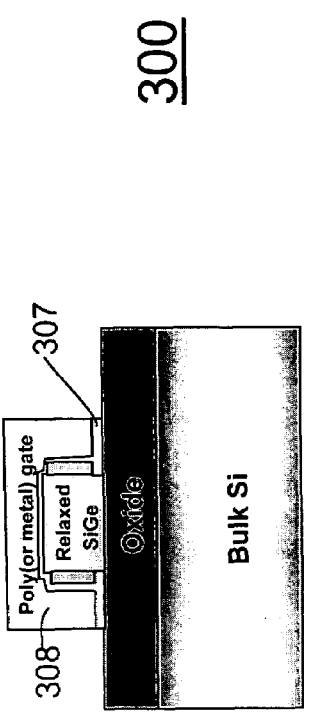
Figure 3H
Figure 3A
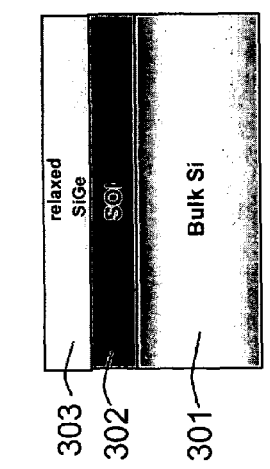
Figure 3D
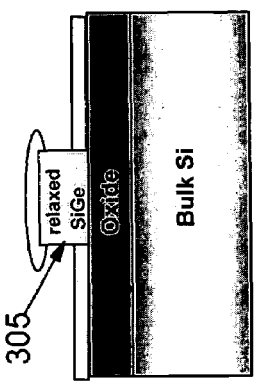
Figure 3G
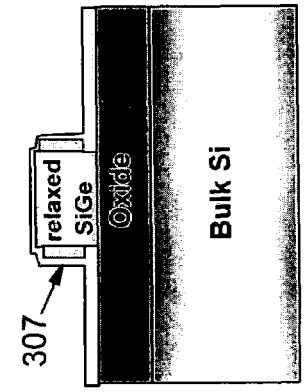

350

450

500

600    610

700    710

HIGH PERFORMANCE STRAINED SILICON FINFETS DEVICE AND METHOD FOR FORMING SAME

BACKGROUND OF THE INVENTION

1. Field of the Invention

The present invention generally relates to a semiconductor device, and more particularly to a high performance strained silicon, Fin field effect transistor (FinFET) device.

2. Description of the Related Art

Fin FETs are considered promising candidates for complementary metal oxide semiconductor (CMOS) device scaling (e.g., see Hu Chenming et al., U.S. Pat. No. 6,413,802 entitled "FinFET transistor structures having a double gate channel extending vertically from a substrate and methods of manufacture").

Indeed, FinFETs are a type of double gate structure which offer high silicon current delivery than single gate devices. Further, FinFETs improve the short channel characteristics of the device and are easier to scale down from.

The fabrication of a FinFET is generally simpler than most other double-gate structures, although the channel thickness control is problematic in most known approaches (e.g., see U.S. Pat. No. 6,413,802; Yang-Kyu Choi et al., "Spacer FinFET: nanoscale double-gate CMOS technology for the terabit era", Solid-State Electronics, 46, p. 1595, (2002)).

Additionally, to increase the device current drive, high carrier mobility is required. MOSFETs with high carrier mobility are made by fabricating the device on strained silicon (e.g., see K. Rim et al. "Fabrication and Analysis of Deep Submicron Strained-Si N-MOSFET's", IEEE Trans. Electron Devices, 47(7), p. 1406, (2000)). A MOSFET fabricated in 001-oriented silicon under biaxial tensile strain exhibits higher carrier mobilities than a conventional MOSFET (e.g., see K. Rim, J. L. Hoyt, J. F. Gibbons, "Fabrication and Analysis of Deep Submicron Strained-Si N-MOSFET's", IEEE Trans. Electron Devices, 47(7), p. 1406, (2000)). The higher carrier mobility leads to a higher current drive and thus a faster/shorter switching time is obtained.

The "strained" silicon film is typically formed by growing an epitaxial silicon layer on top of a strain-relaxed, graded SiGe layer structure (e.g., see P. M. Mooney, Materials Science and Engineering Reports R17, p. 105 (1996) and references therein).

As known, Ge has a lattice constant which is approximately 4% larger than the lattice constant of Si, and the lattice constant of the alloy, $Si_{1-x}Ge_x$, increases approximately linearly with increasing Ge mole fraction, x, of the alloy. Since these semiconductors have cubic symmetry, the in-plane and out-of-plane lattice constants are equal in unstrained crystalline films or bulk crystals.

Herein, "strained" (or fully strained) means that the in-plane lattice constant of the SiGe layer, which is larger than that of the Si substrate, is compressed so that it matches that of the Si substrate, thereby resulting in a corresponding expansion of the out-of-plane lattice parameter such that the in-plane and out-of-plane lattice parameters of the SiGe layer are no longer equal. A SiGe layer is partially strained or partially relaxed when the in-plane lattice parameter is larger than that of Si, but still smaller than the out-of-plane SiGe lattice parameter. The SiGe is fully "relaxed" or unstrained when the in-plane and out-of-plane lattice parameters are equal. For Si under biaxial tensile strain (e.g., when it is grown epitaxially on a partially or fully relaxed SiGe layer), the in-plane lattice parameter is larger than the out-of-plane lattice parameter.

Thus, strained silicon is useful for increasing the performance over conventional silicon devices. Indeed, a strained silicon (e.g., tensilely strained or compressively strained) may offer 1.5 times the carrier mobility over conventional silicon devices.

The conventional techniques for making strained silicon are applicable for planar devices such as the conventional MOSFET. Examples for such techniques are a graded buffer SiGe layer (e.g., see P. M. Mooney, Materials Science and Engineering Reports R17, p. 105 (1996) and references cited therein), and the relaxation by ion implantation and anneal (e.g., see U.S. Pat. No. 6,593,625 by S. H. Christiansen et al., entitled "Relaxed SiGe layers on Si or silicon on insulator substrates by ion implantation and thermal annealing").

Thus, strained Si complementary metal oxide semiconductor (CMOS) devices with strained Si channel on a relaxed $Si_{1-x}Ge_x$ buffer layer are known to offer better device performance over conventional Si CMOS because of the enhancement in both channel electron and hole mobilities in the strained silicon film.

That is, a MOSFET fabricated in 001-oriented silicon under biaxial tensile strain exhibits higher carrier mobilities than a conventional MOSFET (e.g., see K. Rim, J. L. Hoyt, J. F. Gibbons, "Fabrication and Analysis of Deep Submicron Strained-Si N-MOSFET's", IEEE Trans. Electron Devices, 47(7), p. 1406, (2000)). The higher carrier mobility leads to a higher current drive and thus a faster/shorter switching time is obtained.

The "strained" silicon film is typically formed by growing an epitaxial silicon layer on top of a strain-relaxed, graded SiGe layer structure (e.g., see P. M. Mooney, Materials Science and Engineering Reports R17, p. 105 (1996) and references therein).

A thin SiGe layer grown epitaxially on a Si(001) substrate will be strained, with the in-plane lattice parameter matching that of the Si substrate. In contrast, when a thicker layer is grown, the strain will be relaxed by the introduction of dislocations, specifically 60° misfit dislocations when the lattice mismatch is <2%. The thicker the layer, the more dislocations present and the more relaxed the SiGe layer is. The misfit dislocation is the boundary of a missing plane of atoms. It is typically a half loop, with a misfit segment running parallel to the SiGe/Si interface terminating in threading arms that go the wafer surface. The presence of the misfit dislocation creates an atomic step at the wafer surface. Strain relaxation by the introduction of crystal defects is known as "plastic strain relaxation".

Plastic strain relaxation results in a rough surface that exhibits a cross hatch pattern, which raises surface roughness/topography issues as described below, and a threading dislocation density in the range of $10^5$-$10^8$ $cm^{-2}$ in the upper part of the relaxed SiGe layer and the strained Si film. The strain fields from the misfit dislocation network introduce so-called mosaic structure in the SiGe and Si layers, which is detected as a broadening of the x-ray rocking curve. Triple-axis x-ray diffraction measurements can distinguish mosaic broadening from other effects, such as a non-uniform SiGe lattice parameter or alloy composition, that can also cause a broadening of the x-ray rocking curve. The exact nature of the mosaic structure in the upper part of the SiGe film and the strained Si layer is determined by the arrangement of the misfit dislocations, which will vary depending on the SiGe layer structure and the epitaxial growth conditions used to fabricate the structure.

Thus, such strained silicon channels improve and increase the silicon current delivery capability, and improve the short channel characteristics. Additionally, such strained silicon devices are easier to scale down from. Further, strained silicon is used to increase performance by making the channel strained (tensile), an increase of 1.5 times the mobility of conventional silicon can be achieved.

However, such strained silicon channels have not been demonstrated for devices as small as 50 nm or less.

As mentioned above, another conventional device is the FinFET, which has found advantageous use because of its double gate structure. That is, conventional devices have typically used a single gate structure. The FinFET uses a double gate structure, thereby to allow more control and to reduce power.

However, for FinFET devices, strained silicon has been difficult to integrate due to the geometry of the fin and the gate and the fabrication process.

Thus, prior to the present invention, there has been no effective method (nor structure resulting from the method), in which FinFET devices have been formed with strained silicon. Such a combination of strained silicon with a silicon FinFET would offer enhanced channel mobility and be substantially defect-free.

SUMMARY OF THE INVENTION

In view of the foregoing and other exemplary problems, drawbacks, and disadvantages of the conventional methods and structures, an exemplary feature of the present invention is to provide a method and structure in which a silicon FinFET device is formed having strained silicon under the gate.

In a first aspect of the present invention, a Fin Field Effect Transistor (FinFET) (and method for forming the same) includes a relaxed first material having a sidewall, and a strained second material formed on the sidewall of the first material. The relaxed first material and the strained second material form at least a fin of the FinFET.

With the unique and unobvious exemplary aspects of the present invention, a new FinFET device (and method for forming the same) is provided with FIN device structure (typically below sub-50 nm in FIN width) made out of relaxed $Si_xGe_{1-x}$ on insulator (SGOI)) with strained Si epi on the sidewalls of the $Si_xGe_{1-x}$ FIN structures.

With the invention, new processes are provided for forming the new FinFET device structures with strained Si sidewall. Thus, the invention provides a combination of strained silicon with a silicon FinFET.

As a result, numerous advantages of the FinFETs device structures of the present invention accrue over the conventional FinFETs and other advanced double gate devices.

First, the epitaxially strained Si on $Si_xGe_{1-x}$ FIN structures provide additional enhanced channel mobility over conventional all-silicon FinFET structures and this improves device performance over conventional all-silicon FINFET devices.

Additionally, the epitaxially-strained Si on the sidewalls of the $Si_xGe_{1-x}$ FIN structures is less affected by threading defects that arise from the relaxed graded buffer layer, and which are always found in the conventional planar strained silicon CMOS devices.

Thus, the invention results in much better yield in manufacturing over planar strained silicon CMOS devices.

BRIEF DESCRIPTION OF THE DRAWINGS

The foregoing and other exemplary purposes, aspects and advantages will be better understood from the following detailed description of exemplary embodiments of the invention with reference to the drawings, in which:

FIGS. 3A-3H illustrate a process for forming a strained FinFET 300 according to the present invention;

DETAILED DESCRIPTION OF EXEMPLARY EMBODIMENTS OF THE INVENTION

Figure 2:
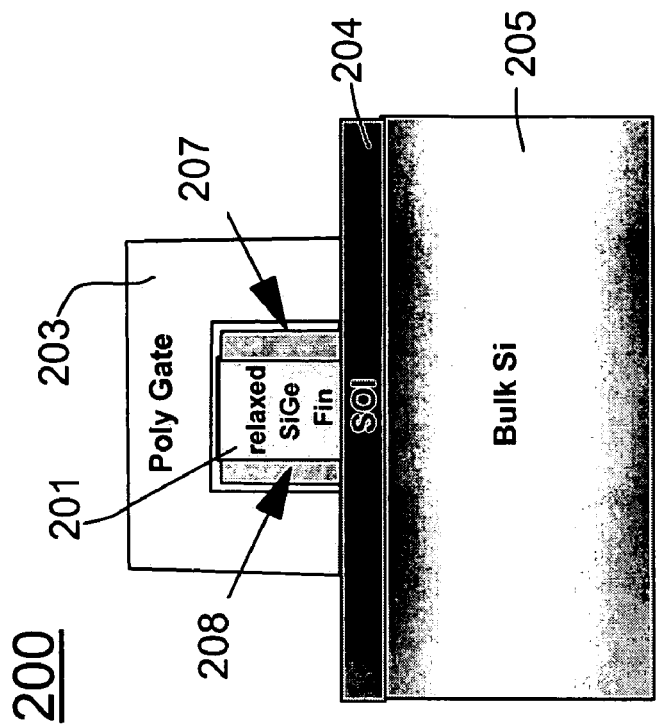
FIG. 2 illustrates a cross-sectional view of the strained FinFET device of FIG. 1 in a gate area thereof according to the present invention.

Referring now to the drawings, and more particularly to FIGS. 1-8D, there are shown exemplary embodiments of the method and structures according to the present invention.

Exemplary Embodiment

Figure 1:
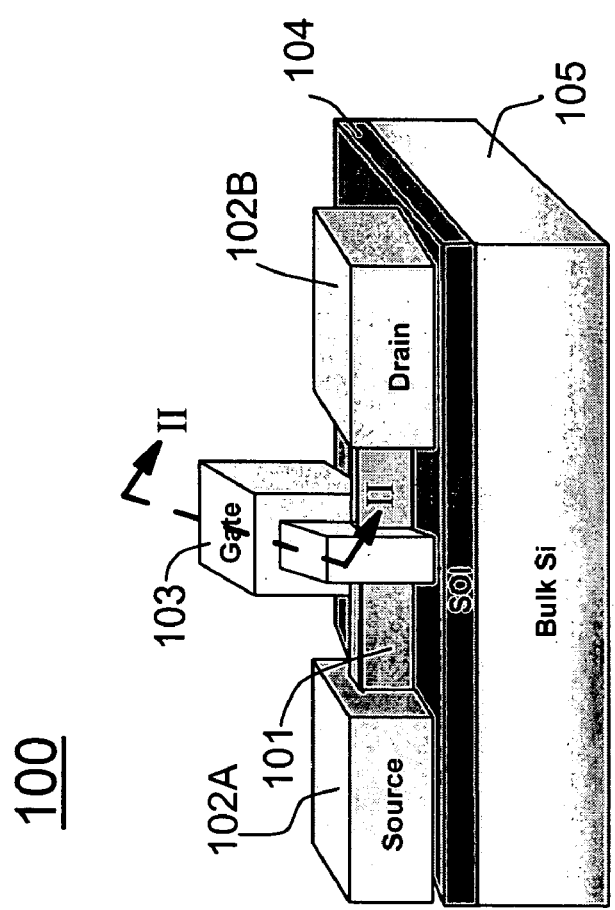
FIG. 1 illustrates a device layout of a strained FinFET device 100 according to the present invention.

Turning to FIG. 1, the device layout of a strained FinFET 100 according to the present invention is shown.

As shown, the FinFET device 100 includes a Fin device structure (typically below sub-50 nm in Fin width) made out of relaxed silicon germanium ($Si_xGe_{1-x}$) on insulator (SGOI)) with strained Si epitaxially formed on the sidewalls of the $Si_xGe_{1-x}$ FIN structures.

In FIG. 1, the FinFET 100 includes a fin 101, formed adjacent a source and drain 102A, 102B. A gate 103 (e.g., preferably formed of polysilicon, but of course metal could be employed as would be known by one of ordinary skill in the art) is formed adjacent the fin 101. The FinFET 100 is formed on a silicon-on-insulator (SOI) layer 104 which can be formed of an oxide, nitride, etc. The SOI layer 104 is formed on a bulk silicon substrate 105.

With the invention, processes have been developed to generate the new FINFET device structures with strained Si sidewalls. FIGS. 2-5 highlight the details of the invention, the inventive process development, and experimental results to demonstrate the successful fabrication of the strained Si sidewall structure according to the present invention, with the new processes and the existence of strain in the epitaxially grown Si using Convergent Beam Electron Diffraction (CBED) analysis in high resolution scanning transmission electron microscope.

Turning to FIG. 2, a cross-section 200 of the gate area of the FinFET 100 of FIG. 1 with the cross-sectional view being shown along arrows II-II of FIG. 1. In FIG. 2, an SOI layer 204 is formed on a bulk silicon substrate 205.

In the gate area, a fin 201 is formed of relaxed SiGe preferably having a composition of Ge within a range of about 20% to about 70% Ge, and preferably having a thickness in a range of about 50 nm to about 100 nm.

On sidewalls of the relaxed SiGe fin 201, a strained silicon 208 is formed, via selective epitaxial growth. Preferably, the strained silicon sidewalls have a thickness of about 5 nm to about 20 nm.

A gate oxide, preferably formed of silicon dioxide and preferably having a thickness of about 1 nm to about 5 nm, is formed adjacent the strained silicon sidewalls, and adjacent (e.g., over) the top of the relaxed SiGe fin 201. Instead of oxide, other materials could be employed such as $HFO_2$ (e.g., a high K dielectric).

A gate 203 (e.g., formed of polysilicon or metal) is formed over the gate oxide 207, over relaxed SiGe fin 201 and the strained silicon sidewalls 208, to complete the structure.

In operation, voltage is supplied to the drain and source contacts. When voltage is applied to the gate and is above threshold voltage, current flows between the source and drain region of this fin connecting to the source and drain. Therefore, since the gate covers both sides of the fin, twice the amount of current flow between source and drain for the given gate voltage compared with the planar single gate device.

First Exemplary Method

Figure 3I:
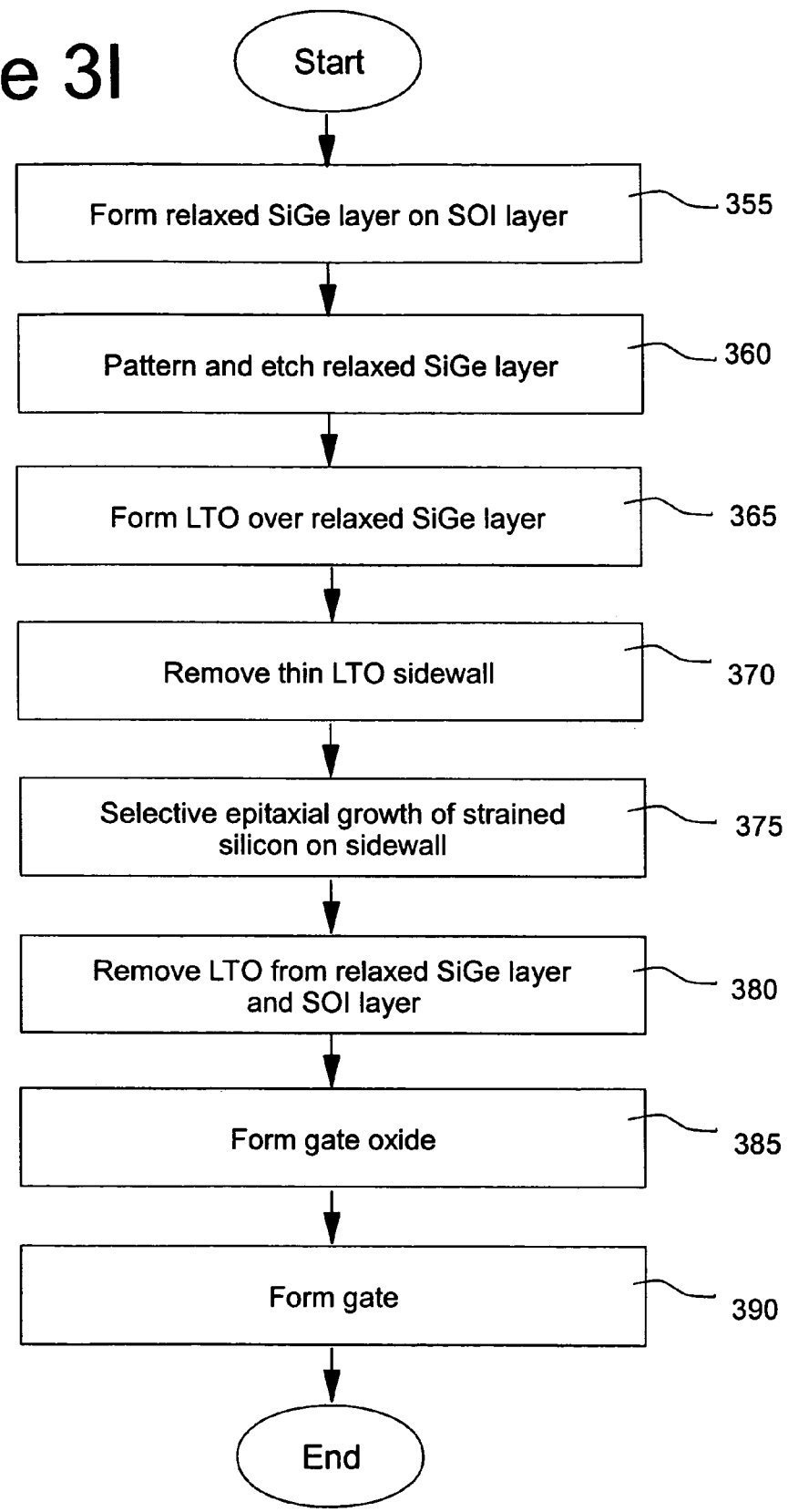
FIG. 3I illustrates a flowchart 350 of the processing of FIGS. 3A-3H.

Turning now to FIGS. 3A-3H and the flowchart 350 of FIG. 3I, a process of forming a FinFET 300 according to the present invention is shown.

First, in FIG. 3A (and step 355 of the flowchart 350 in FIG. 3I), over a substrate (e.g., a silicon-on-insulator (SOI) layer 302 formed on a bulk silicon 301), a relaxed SiGe layer 303 is formed. Preferably, the thickness of the SiGe layer 303 is within a range of about 50 nm to about 100 nm.

Preferably, the SiGe layer 303 is a graded layer formed by epitaxial growth.

Additionally, the percentage of Ge in the SiGe layer is preferably within a range of about 20% to about 70%, and more preferably about 20% to about 40%.

Figure 3J:
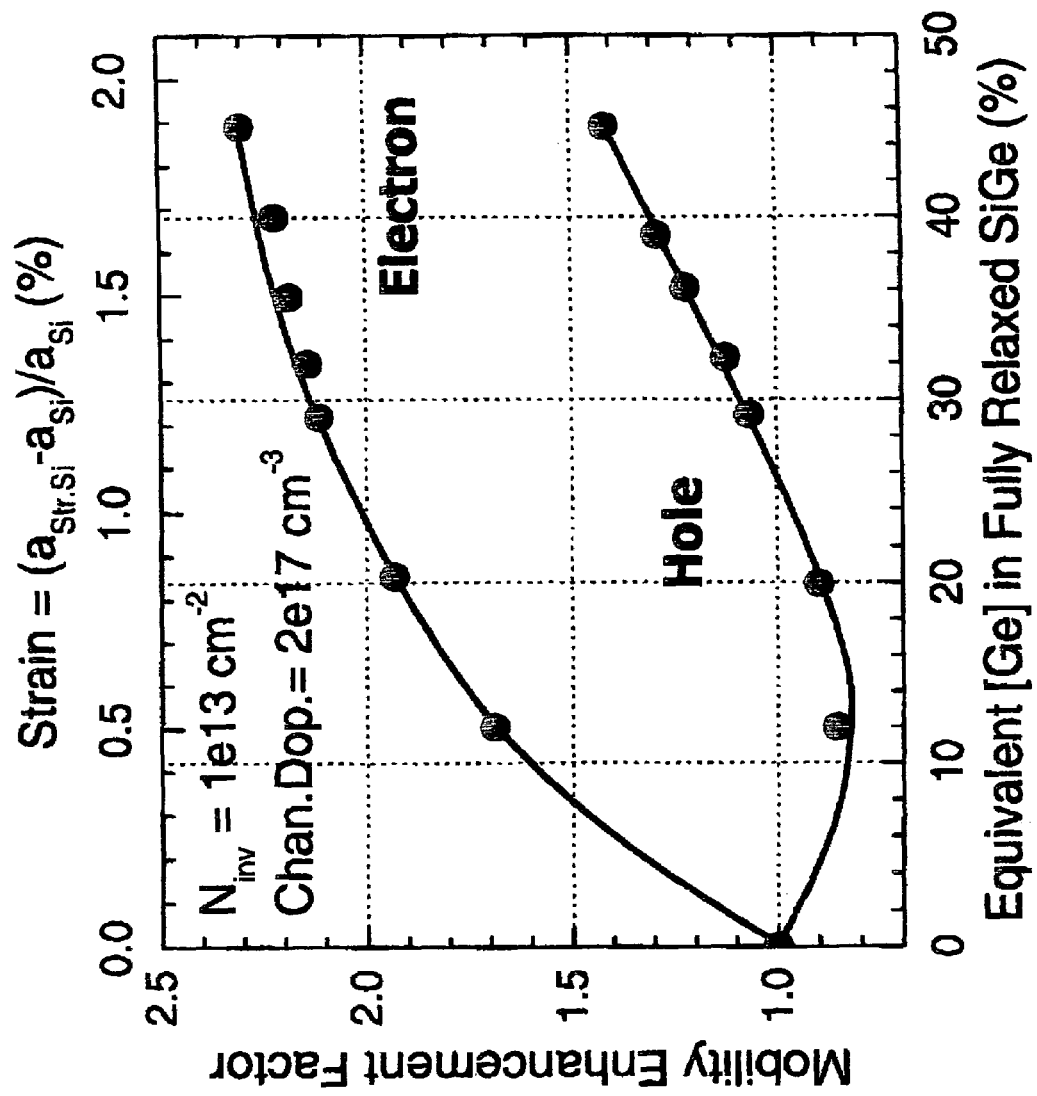
FIG. 3J shows a graph illustrating a relationship of mobility vs. Ge content.

As the percentage of Ge is increased, the strain increases and the carrier mobility similarly increases. Thus, for a 20% composition of Ge in the SiGe layer, electron mobility will be increased about 1.8 times that of conventional silicon. For a 30% composition of Ge in the SiGe layer, electron mobility will be increased about 2.0 times that of conventional silicon, and for a 40% composition of Ge in the SiGe layer, mobility will be increased about 2.5 times that of conventional silicon. However, increasing the % of Ge about 40% generally will not increase the carrier mobility substantially any more, and thus a plateau is reached. FIG. 3J shows a graph illustrating a relationship of mobility vs. Ge content.

In FIG. 3B (and step 360 of the flowchart 350 in FIG. 3I), the relaxed SiGe layer is patterned and etched, preferably by a reactive ion etch (RIE) or the like.

In FIG. 3C (and step 365 of the flowchart 350 in FIG. 3I), a special low temperature CVD grown oxide 304 with a very thin sidewall (e.g., preferably having a thickness within a range of about 10 nm to about 20 nm) is deposited by CVD over the relaxed SiGe and exposed portions of the SOI layer 302. The oxide will be thinner on the sidewalls, but will be thicker (e.g., within a range of about 30 nm to about 50 nm) on the gate/top of the relaxed SiGe layer and the silicon-on-insulator layer.

In FIG. 3D (and step 370 of the flowchart 350 in FIG. 3I), as shown at reference numeral 305, the thin sidewall LTO is removed, for example, by wet chemical etch. The LTO formed over the exposed portions of the SOI layer 302 and the top surface of the relaxed SiGe 303 is left. As also shown, the LTO overhangs the sidewall.

Then, in FIG. 3E (and step 375 of the flowchart 350 in FIG. 3I), as shown at reference numeral 306, strained silicon is selectively epitaxially grown on the sidewall of the relaxed SiGe layer. Preferably, the strained silicon has a thickness of about 5 nm to about 20 nm.

Then, in FIG. 3F (and step 380 of the flowchart 350 in FIG. 3I), the LTO 304 is removed from the top of the relaxed SiGe and from the SOI layer 302, preferably by a wet chemical etch. Thus, the selective epitaxial strained silicon is left on the sidewalls of the relaxed SiGe layer.

Thereafter, in FIG. 3G (and step 385 of the flowchart 350 in FIG. 3I), a gate oxide 307 (e.g., such as $SiO_2$ or $HFO_2$, preferably having a thickness in a range of about 1 nm to about 5 nm) is formed conformally over the strained silicon sidewall and the top of the relaxed SiGe layer 303.

Finally, in FIG. 3H (and step 390 of the flowchart 350 in FIG. 3I), a gate, preferably formed of polysilicon or metal, and preferably having a thickness in a range of about 100 nm to about 150 nm, is formed over the structure, and a gate etch is performed. The gate etch also removes the thin gate oxide, as shown in FIG. 3H. It is noted that the source and drain are formed before the gate is formed.

With the unique and unobvious exemplary aspects of the present invention, a new FinFET device (and method for forming the same) is provided with a FIN device structure (typically below sub-50 nm in FIN width) made out of a relaxed $Si_xGe_{1-x}$ on insulator (SGOI)) with strained Si epitaxially formed on the sidewalls of the $Si_xGe_{1-x}$ Fin structures.

Thus, the first exemplary embodiment of the present invention forms a FINFET device structure with a strained Si sidewall. Hence, the invention provides a combination of strained silicon with a silicon FinFET. The epitaxially strained Si on the $Si_xGe_{1-x}$ Fin structure provides additional enhanced channel mobility over the conventional all-silicon FinFET structures, and improves device performance over conventional all-silicon FinFET devices.

It is noted that as mentioned above, the SiGe layer 303 is a graded buffer layer, and will gradually become more and more relaxed in a direction away from the silicon surface of the SOI layer.

That is, in a direction away from the silicon, the lattice of the SiGe will take the form of a SiGe lattice completely (e.g., as though the SiGe was formed as a bulk SiGe structure, assuming such a structure would be possible). Strain leads to a mismatch of the crystal plane. To make up for the strain, the structure attempts to compensate, and thereby dislocations and misfits are typically formed in the lattice cell, as described above. The dislocations and misfits result in threading defects.

Such threading defects are problematic as they tend to propagate to the strained silicon and build up, thereby potentially damaging or destroying the device.

However, the inventive structure using the FinFET, is less prone to such threading defects since the fin's width (SiGe and strained Si) is small (i.e., <0.1 μm). Thus, the inventive structure will have a smaller defect density than the conventional all-silicon, single gate devices.

It is noted that while the invention discloses beginning with a relaxed substrate, this is not required. Indeed, one can obtain relaxed SiGe with strained sidewalls by starting with relaxed SiGe, or as a second option one can start with strained SiGe (e.g., so-called psuedomorphic structure), which will then self-relax when the SiGe fin width is less than 0.1 μm.

Second Exemplary Embodiment

A second exemplary embodiment, as shown in FIGS. 4A-4E, is advantageous as it allows the invention to minimize the number of mask steps. Indeed, it allows the invention to avoid a mask step since as shown and described below, there is a fin oxide hard mask above, and an oxide layer below, the relaxed SiGe layer. It is noted that thin silicon (~5-10 nm) from the SOI is removed after the SiGe Fin RIE.

As a result, the second exemplary embodiment provides a process which is automatically self-aligned, thereby providing a more simple and elegant method even for a small gate. Hence, this embodiment provides self-aligned masking for selective growth. Moreover, there is no need to remove the hard mask to dope the top of the structure, as the invention allows doping on the sides of the structure.

Figure 4A:
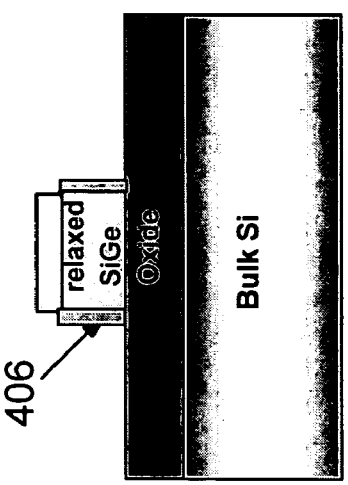
FIGS. 4A-4E illustrate a process for forming a strained FinFET 400 according to the present invention.
Figure 4B:
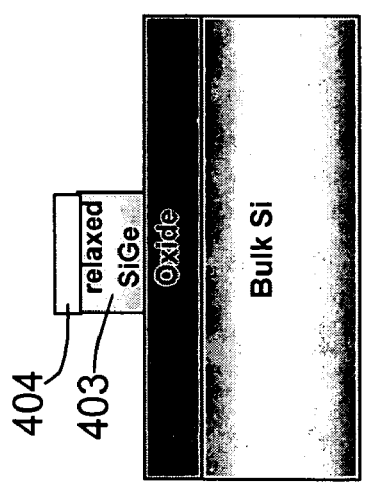
Figure 4C:
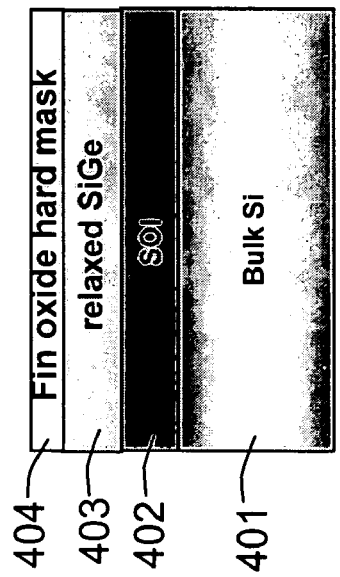
Figure 4D:
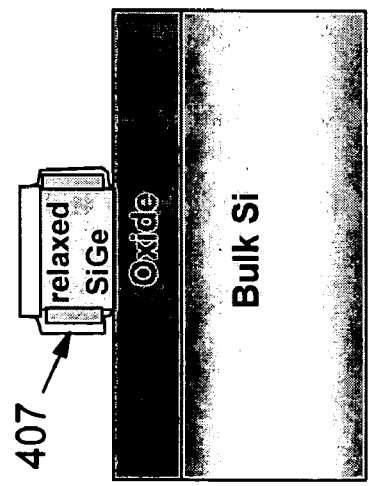
Figure 4E:
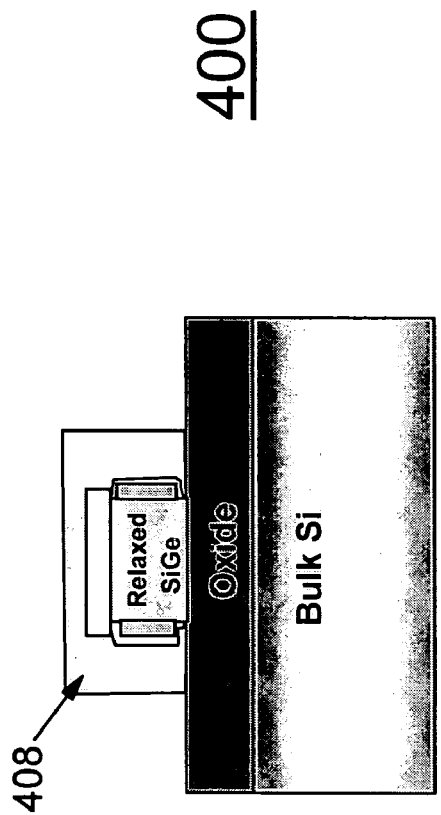
Figure 4F:
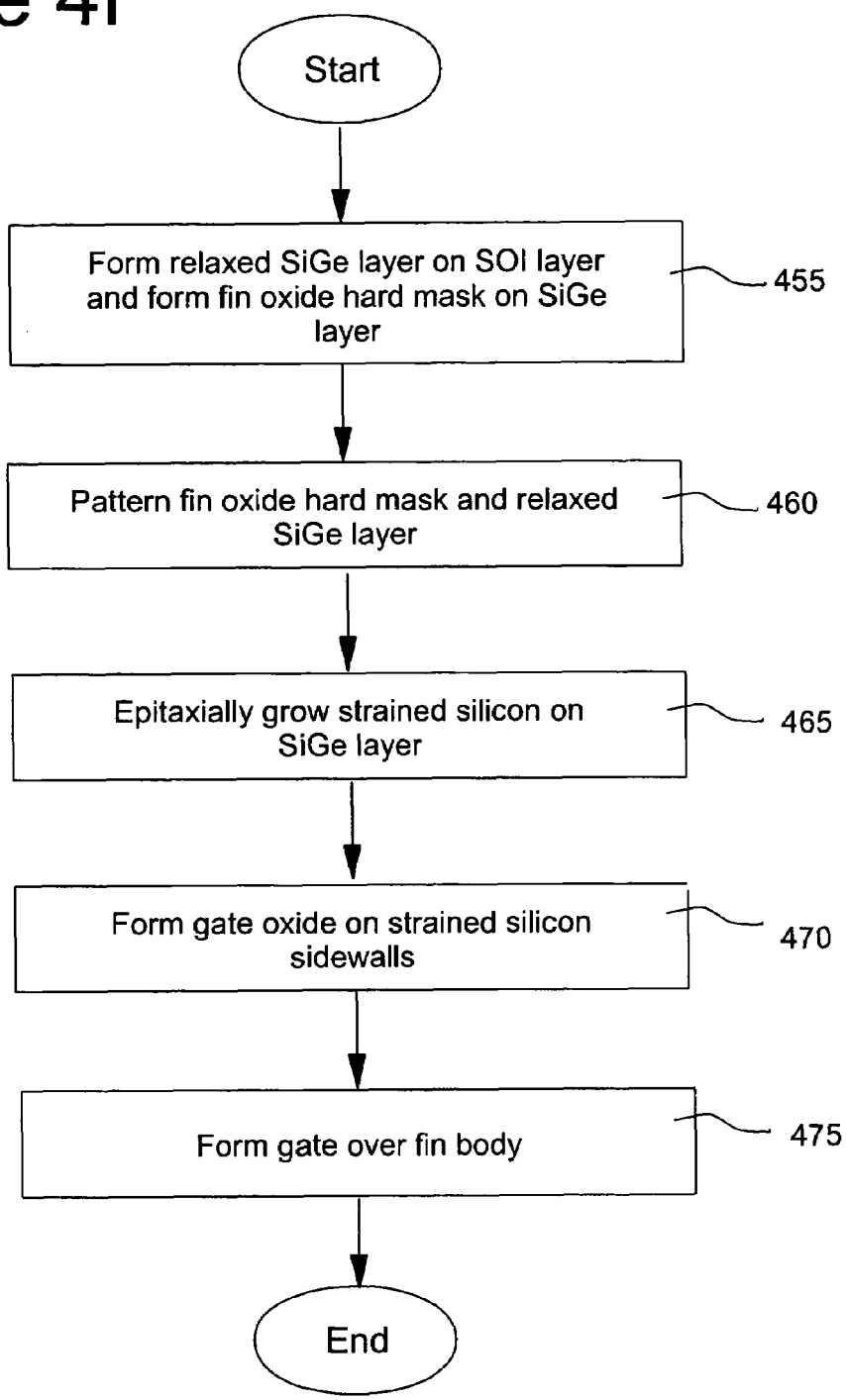
FIG. 4F illustrates a flowchart 450 of the processing of FIGS. 4A-4E.

Turning now to FIGS. 4A-4E and the flowchart 450 of FIG. 4F, a process of forming a FinFET 400 according to the present invention is shown.

First, in FIG. 4A (and step 455 of the flowchart 450 in FIG. 4F), over a substrate (e.g., a silicon-on-insulator (SOI) layer 402 formed, for example, on a bulk silicon 401), a relaxed SiGe layer 403 is formed. Preferably, the thickness of the SiGe layer 43 is within a range of about 50 nm to about 100 nm.

Preferably, the SiGe layer 403 is a graded layer formed by epitaxial growth. Additionally, as before, the percentage of Ge in the SiGe layer is preferably within a range of about 20% to about 70%, and more preferably about 20% to about 40%.

On top of the relaxed SiGe layer 403, a fin hard oxide mask 404 is formed. The mask 404 may be formed from low temperature CVD oxide materials with a thickness of the mask being between about 30 nm to about 50 nm.

In FIG. 4B (and step 460 of the flowchart 450 in FIG. 4F), the relaxed SiGe layer 403 and the fin oxide hard mask 404 are patterned and etched, preferably by a reactive ion etch (RIE) or the like.

In FIG. 4C (and step 465 of the flowchart 450 in FIG. 4F), strained silicon 406 is selectively epitaxially grown on the sidewalls of the relaxed SiGe layer 403. Preferably, the strained silicon has a thickness of about 5 nm to about 20 nm.

Then, in FIG. 4D (and step 470 of the flowchart 450 in FIG. 4F), a gate oxide 407 (e.g., such as $SiO_2$ or $HFO_2$, preferably having a thickness in a range of about 1 nm to about 5 μm) is deposited.

Finally, in FIG. 4E (and step 475 of the flowchart 450 in FIG. 4F), a gate 408, preferably formed of polysilicon or metal, and preferably having a thickness in a range of about 100 nm to about 150 nm, is formed over the fin body structure, and a gate etch is performed, to complete the structure. It is again noted that the source and drain would be formed before the gate is formed.

Thus, this aspect of the invention minimizes a number of mask steps, and specifically allows the invention to avoid a masking step since the hard mask 404 is provided above, and the SOI layer 402 is provided below, the relaxed SiGe layer 403.

As a result, less steps are required, and the process is automatically self-aligned (e.g., no need for additional patterning or etching), thereby providing a more simple and elegant method even for a small gate width. Hence, this embodiment provides self-aligned masking for selective growth. Moreover, there is no need to remove the hard mask to dope the top of the structure, as the invention allows doping on the sides of the structure.

Figure 5:
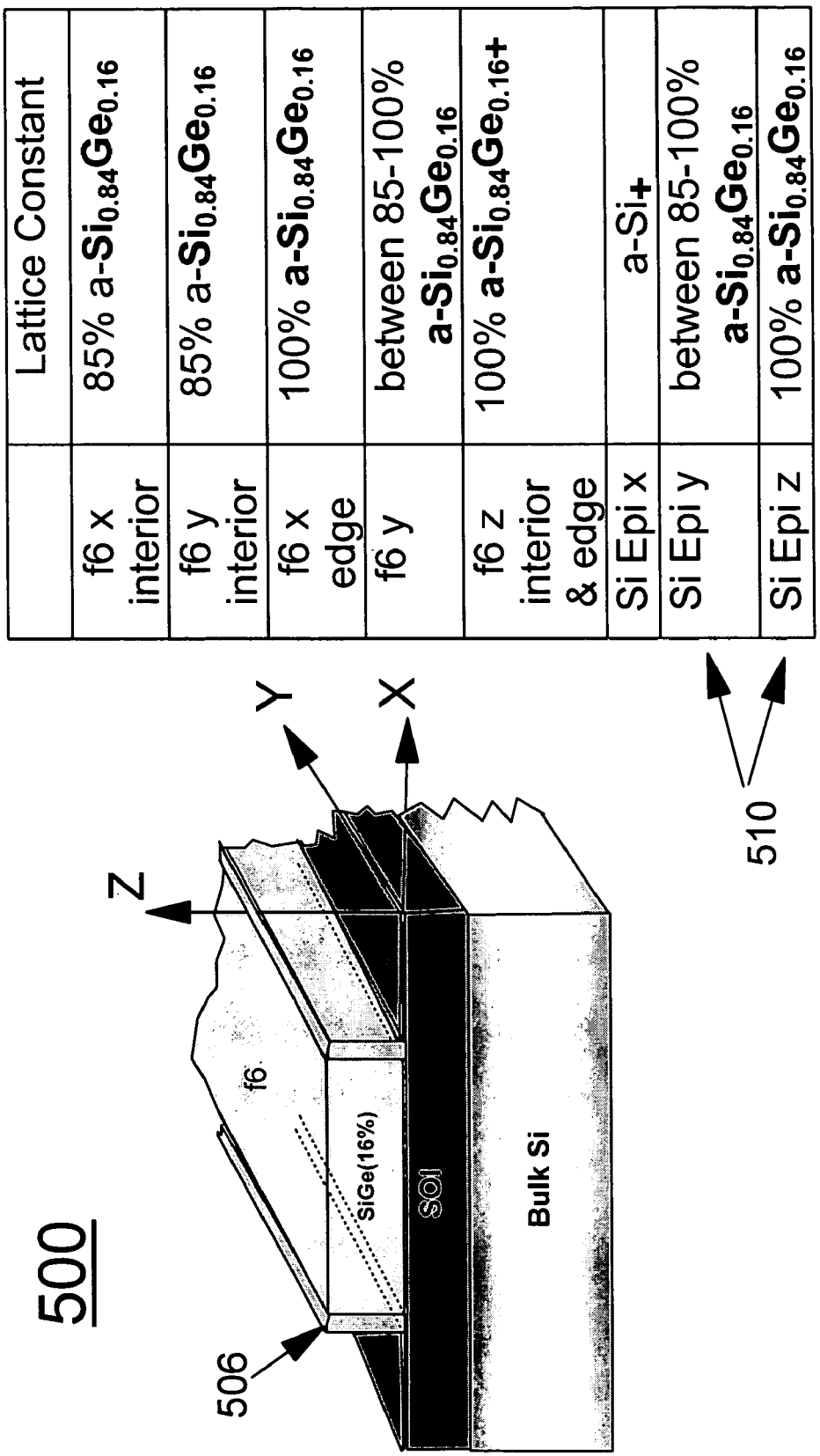
FIG. 5 illustrates schematically the lattice spacing distribution in different parts of the strained FinFET formed exemplarily of 16% relaxed SiGe layer on SiGe on insulator (SGOI)

FIG. 5 illustrates schematically the computed lattice spacing distribution in different parts of the stained FINFET formed exemplarily of 16% relaxed SiGe layer on SiGe on insulator (SGOI).

Reference numeral 506 represents strained silicon epitaxially grown on the sidewalls of the SiGe (16%) fin, whereas reference numeral 510 represents that the epitaxial silicon is tensile strained along the Y-Z plane. The number 85-100% represents the degree of relaxation deduced from distribution.

As shown in the experimental results of FIGS. 6-8D, the invention has been demonstrated to be very advantageous over the conventional all-silicon single gate structures.

Figure 6:
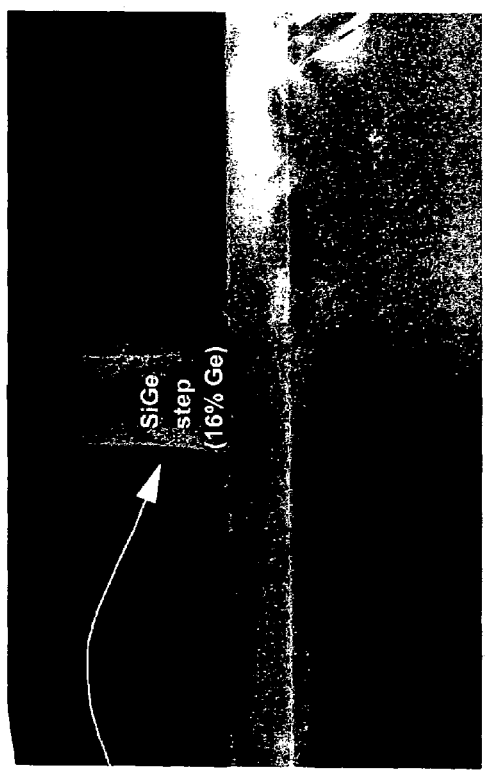
FIG. 6 is a transmission electron micrograph (TEM) which shows Si epitaxial growth on the sidewall of the rapid thermal chemical vapor deposition (RTCVD) with 20% Ge psuedomorphic SiGe step.

FIG. 6 is a transmission electron micrograph (TEM) 600 which shows at reference numeral 610 selective Si epitaxial growth on the sidewall of a psuedomorphic SiGe fin. The psuedomorphic SiGe is deposited by a RTCVD method.

Figure 7:
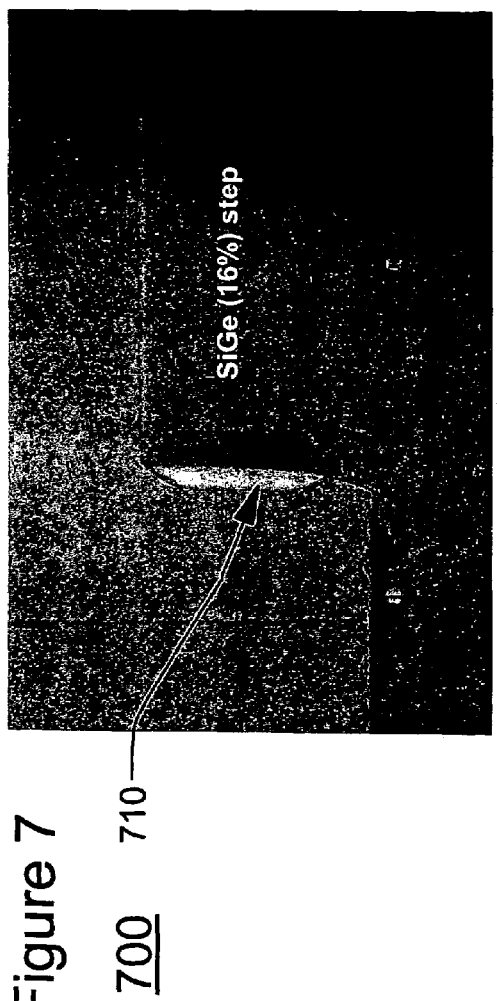
FIG. 7 is a transmission electron micrograph (TEM) which shows Si epitaxial growth on the sidewall of the ultra high chemical vapor deposition (UHCVD) with 20% Ge 95% relaxed SiGe step.

FIG. 7 is a transmission electron micrograph (TEM) 700 which shows selective Si epitaxial growth on the sidewall of a 20% Ge 95% relaxed SiGe fin. The SiGe fin is deposited by RTCVD.

FIGS. 8A-8D illustrate a convergent beam electron diffraction (CBED) for strain measurements in different regions (e.g., Regions 8A-8C shown in FIGS. 8B-8D respectively) of the SiGe buffer layer structure with selective epitaxially grown silicon.

Figure 8C:
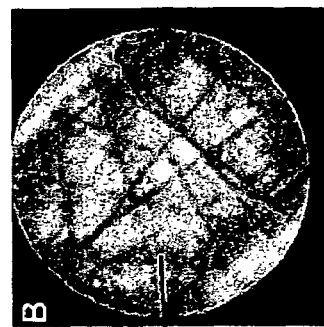
FIGS. 8A-8D illustrate a convergent beam electron diffraction (CBED) for strain measurements in different regions (e.g., Regions 8A-8C shown in FIGS. 8B-8D respectively) of the SiGe buffer layer step structure with selective epitaxially grown silicon.
Figure 8A:
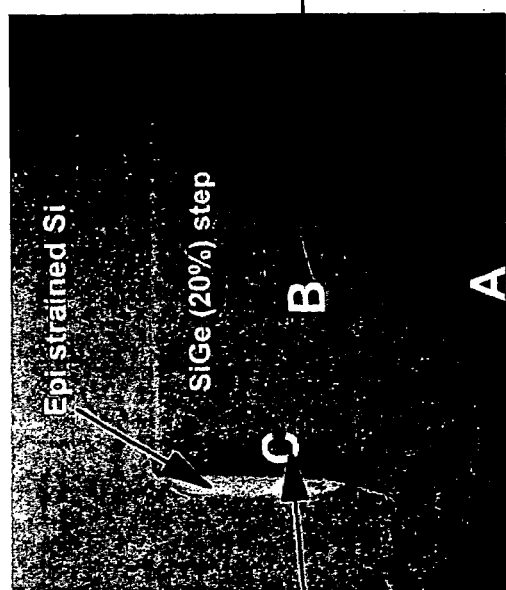
Figure 8B:
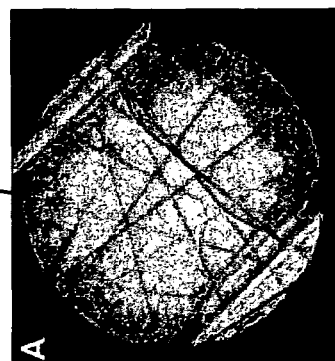

Specifically, FIG. 8B shows that similar distinct high order Laue zone lines indicate that region B in the SiGe structure is relaxed and not strained.

FIG. 8C shows that distinct high order Laue zone lines obtained with CBED in a relaxed region of the SiGe buffer layer.

Figure 8D:
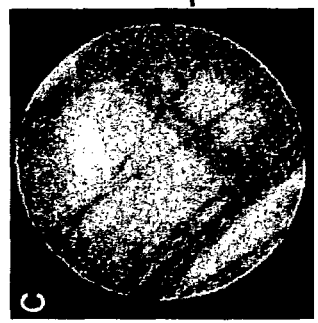

In FIG. 8D, the blurred Laue zone lines in region C in the SiGe indicate strain in this part of the SiGe. The strain in SiGe region C is induced by the strain in the selectively grown epitaxial Si layer with 2 dimensionally limited geometry. The two-dimensional limited geometry refers to small fin sidewall dimensions.

Thus, as discussed above, with the unique and unobvious exemplary aspects of the present invention, a new FinFET device (and method for forming the same) is provided with a Fin device structure (typically below sub-50 nm in Fin width) made out of a relaxed $Si_xGe_{1-x}$ on insulator (SGOI)) with strained Si epitaxially formed on the sidewalls of the $Si_xGe_{1-x}$ Fin structures.

The present invention provides many advantages over conventional FinFETs and other advanced double gate devices including that epitaxially strained Si on $Si_xGe_{1-x}$ Fin structures provide additional enhanced channel mobility over current all silicon FinFET structures and this improves device performance over conventional all-silicon FinFET devices.

Additionally, the epitaxially strained Si on the sidewall of the $Si_xGe_{1-x}$ Fin structures is less affected by threading defects that arise from the relaxed graded buffer layer and which are always found in the planar strained silicon CMOS devices. Hence, this invention leads to much better yield in manufacturing over planar strained silicon CMOS devices.

While the invention has been described in terms of several exemplary embodiments, those skilled in the art will recognize that the invention can be practiced with modification within the spirit and scope of the appended claims.

Further, it is noted that, Applicant's intent is to encompass equivalents of all claim elements, even if amended later during prosecution.

What is claimed is:

1. A Fin Field Effect Transistor (FinFET), comprising:
a relaxed first material disposed on a substrate, having a pair of vertically disposed sidewalls extended from a surface of said substrate and a top surface disposed parallel to said substrate; and
a strained second material formed on said pair of sidewalls, wherein said relaxed first material is devoid of said strained second material on said top surface;
wherein said relaxed first material and said second strained material form at least a fin of said FinFET,
wherein said relaxed first material comprises SiGe, having a composition of Ge within a range of about 20% to about 70% Ge, and
wherein said relaxed first material comprises a graded buffer layer such that said relaxed first material is gradually more relaxed at a position distant from the surface of a silicon-on-insulator layer than at a position proximate to the silicon-on-insulator layer.

2. The FinFET of claim 1, wherein said relaxed first material and said second strained material form a channel for a double gate strained FinFET structure.

3. The FinFET of claim 1, wherein said relaxed first material comprises $Si_xGe_{1-x}$.

4. The FinFET of claim 1, wherein said strained second material comprises silicon.

5. The FinFET of claim 1, wherein said fin comprises a fin width below approximately 50 nm.

6. The FinFET of claim 1, further comprising:
a gate oxide formed adjacent the strained second material on the sidewall and over the relaxed first material.

7. A semiconductor device, comprising:
the FinFET according to claim 1.

8. The semiconductor device of claim 7, further comprising:
a gate formed adjacent said fin; and
a source and drain formed on opposite sides of said fin.

9. The semiconductor device of claim 8, wherein said gate is formed of one of polysilicon and metal.

10. The semiconductor device of claim 8, further comprising:
a silicon-on-insulator (SOI) layer on which said relaxed first material is formed.

11. The semiconductor device of claim 10, wherein said silicon on insulator comprises a silicon on oxide, said silicon having a thickness within a range of about 2 nm to about 10 nm.

12. The FinFET of claim 1, wherein said relaxed first material comprises a thickness in a range of about 50 nm to about 100 nm.

13. The FinFET of claim 1, wherein said strained second material comprises a thickness in a range of about 5 nm to about 20 nm.

14. The FinFET of claim 6, wherein said gate oxide comprises a thickness in a range of about 1 nm to about 5 nm.

15. The FinFET of claim 1, wherein a thickness of said fin is less than 0.1 µm.

16. The semiconductor device of claim 1, wherein said portion is less than an entirety of said first material.

17. A Fin Field Effect Transistor (FinFET), comprising:
a relaxed first material, disposed on a substrate, having a pair of vertically disposed sidewalls extended from a surface of said substrate and a top surface disposed parallel to said substrate; and
a strained second material formed on said pair of sidewalls, wherein said relaxed first material is devoid of said strained second material on said top surface;
wherein said relaxed first material and said second strained material form at least a fin of said FinFET, wherein said relaxed first material comprises SiGe, having a composition of approximately 40% Ge,
wherein a thickness of said fin is less than 0.1 µm, and
wherein said relaxed first material comprises a graded buffer layer such that said relaxed first material is gradually more relaxed at a position distant from the surface of a silicon-on-insulator layer than at a position proximate to the silicon-on-insulator layer.

18. A Fin Field Effect Transistor (FinFET), comprising:
a relaxed first material, disposed on a substrate, having a pair of vertically disposed sidewalls extended from a surface of said substrate and a top surface disposed parallel to said substrate;
a strained second material formed on said sidewalls, wherein said relaxed first material is devoid of said strained second material on said top surface, said relaxed first material and said second strained material forming at least a fin of said FinFET;
a gate oxide formed over said first material and said second material;
a polysilicon gate formed over said gate oxide, said first material and said second material;
a silicon-on-insulator layer on which said relaxed first material is formed;
a bulk silicon substrate on which said silicon-on-insulator layer is formed; and
a source and drain formed on opposite sides of said fin,
wherein said relaxed first material comprises SiGe, having a composition of Ge within a range of about 20% to about 70% Ge, and
wherein said relaxed first material comprises a graded buffer layer such that said relaxed first material is gradually more relaxed at a position distant from the surface of a silicon-on-insulator layer than at a position proximate to the silicon-on-insulator layer.

* * * * *